US012647111B2

(12) United States Patent
Djelassi-Tscheck et al.

(10) Patent No.: US 12,647,111 B2
(45) Date of Patent: Jun. 2, 2026

(54) DETECTION OF LEAKAGE CURRENTS IN INTELLIGENT SEMICONDUCTOR SWITCH

(71) Applicant: Infineon Technologies AG, Neubiberg (DE)

(72) Inventors: Christian Djelassi-Tscheck, Villach (AT); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/763,431

(22) Filed: Jul. 3, 2024

(65) Prior Publication Data

US 2025/0015796 A1 Jan. 9, 2025

(30) Foreign Application Priority Data

Jul. 7, 2023 (DE) .......................... 102023118031.2

(51) Int. Cl.
$H03K\ 17/16$ (2006.01)
$H03K\ 17/22$ (2006.01)
$H03K\ 17/30$ (2006.01)
(52) U.S. Cl.
CPC ......... H03K 17/165 (2013.01); H03K 17/223 (2013.01); H03K 17/302 (2013.01)

(58) Field of Classification Search
CPC ...... H03K 17/00; H03K 17/16; H03K 17/161; H03K 17/165; H03K 17/166; H03K 17/22; H03K 17/223; H03K 17/30; H03K 17/302
See application file for complete search history.

(56) References Cited

U.S. PATENT DOCUMENTS

2010/0156426 A1 6/2010 Kang et al.

FOREIGN PATENT DOCUMENTS

DE 102019121794 A1 2/2021

*Primary Examiner* — Diana J. Cheng
(74) *Attorney, Agent, or Firm* — Slater Matsil, LLP

(57) ABSTRACT

In accordance with an embodiment, a method includes activating a semiconductor switch coupled between a supply node and an output node to apply an output voltage to an electrical load coupled to the output node, wherein a supply voltage is provided to the supply node; and performing a leakage current test, comprising: deactivating the semiconductor switch to isolate the electrical load from the supply node; after deactivating the semiconductor switch, checking whether a time that elapses until the output voltage falls below a first voltage level is less than a threshold value; and activating the semiconductor switch after the checking.

20 Claims, 4 Drawing Sheets

DETECTION OF LEAKAGE CURRENTS IN INTELLIGENT SEMICONDUCTOR SWITCH

This application claims the benefit of German Patent Application No. 102023118031.2, filed on Jul. 7, 2023, which application is hereby incorporated herein by reference.

TECHNICAL FIELD

The present description relates generally to the field of electronic circuits, and in particular to the detection of leakage currents in a semiconductor switch.

BACKGROUND

Various types of semiconductor switches are known. By way of example, metal-oxide-semiconductor (MOS) field-effect transistors (MOSFETs) are used in a plurality of applications to replace mechanical switches or fuses, for example. One or more MOSFETs may be integrated into a semiconductor chip together with associated driver circuits, control logic, (current and temperature) sensor circuits, and further circuits. These are often referred to as smart semiconductors or smart switches.

Smart semiconductor switches may be used in a plurality of applications. Such semiconductor switches may be used, not only in the automotive sector, as electronic fuses (what are known as e-fuses). In this case, the switches are switched on most of the time, even if the connected load is inactive. In this case, the load current flowing through the semiconductor switch may be very small (e.g. in the µA range), whereas, when the load is active, the load current may be several amperes.

Smart semiconductor switches may have a significant intrinsic power consumption. Therefore, for some applications, smart semiconductor switches are designed such that they are able to be operated in an idle mode with low power consumption. In this idle mode, most internal circuits (e.g. sensor and diagnostic functions, charge pumps, etc.) of the semiconductor switch are inactive, but the switch remains switched on. The smart semiconductor switch normally switches to the idle mode when the load current falls below a defined threshold value (and possibly further conditions are met). In the idle mode, the monitoring and diagnostic functions that are normally available to the smart semiconductor switch are only available to a limited extent, which is why it is not possible to monitor the connected load without limitation. It is therefore possible, for example, that an impermissibly high leakage current is not detected in a load connected to the semiconductor switch. This, for example, may result in the battery being discharged too quickly when a car is parked, for example.

SUMMARY

One exemplary embodiment relates to a method for a smart semiconductor switch. The method comprises activating a semiconductor switch that connects a supply node, to which a supply voltage is provided, to an output node, to which an electrical load is connected. An output voltage is applied to the electrical load as a result. The method also comprises carrying out a leakage current test. To this end, the semiconductor switch is deactivated (switched off) to isolate the electrical load from the supply node. Furthermore, a check is performed to ascertain whether the time that elapses until the output voltage falls below a first voltage level is less than a (time) threshold value. Finally, the semiconductor switch is activated (switched on) again.

A further exemplary embodiment relates to a smart semiconductor switch, which includes the following: at least one transistor that is connected between a supply node and an output node, and a control circuit that is designed to switch the transistor on and off. In order to carry out a leakage current test, the control circuit is designed to switch the transistor off, to check as to whether the time that elapses until an output voltage present at the output node falls below a first voltage level is less than a threshold value, and to switch the transistor on again.

According to a further exemplary embodiment, the smart semiconductor switch includes at least one transistor that is connected between a supply node (VS) and an output node, and a control circuit that is designed to switch the transistor on and off. In order to carry out a leakage current test, the control circuit is designed to switch the transistor off, to generate a diagnostic signal comprising a pulse with a pulse length that corresponds to the time that elapses until an output voltage output at the output node falls below a first voltage level, and to switch the transistor on again.

A further exemplary embodiment relates to a circuit having at least one transistor that is connected between a supply node and an output node, and having a control circuit that is designed to switch the transistor on and off. The circuit further comprises a controller that is coupled to the control circuit and, in order to carry out a leakage current test, is designed to switch the transistor off using the control circuit, to check as to whether a time that elapses until an output voltage output at the output node falls below a first voltage level is less than a threshold value, and to switch the transistor on again.

BRIEF DESCRIPTION OF THE DRAWINGS

Exemplary embodiments are explained in greater detail below with reference to drawings. The illustrations are not necessarily true to scale and the exemplary embodiments are not restricted just to the aspects illustrated. Rather, importance is attached to illustrating the principles underlying the exemplary embodiments. In the drawings.

DETAILED DESCRIPTION OF ILLUSTRATIVE EMBODIMENTS

Figure 1:
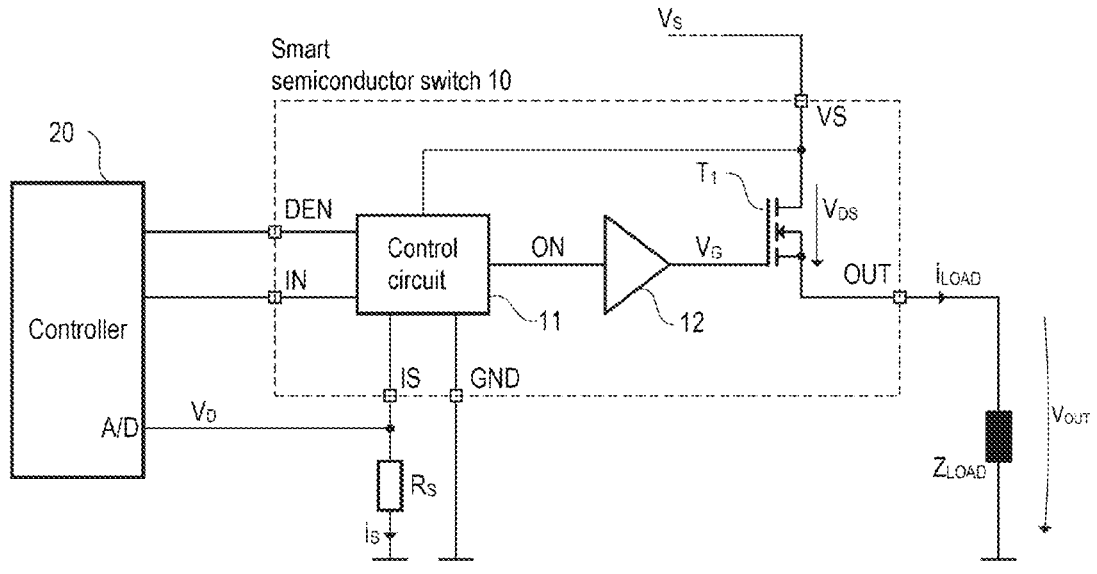
FIG. 1 is a simplified circuit diagram of a smart semiconductor switch with a connected load and a controller that actuates the smart semiconductor switch.

FIG. 1 shows the use of a smart semiconductor switch 10 for actuating a load ZLOAD, wherein the smart semiconductor switch is actuated by an external controller 20 (e.g. a microcontroller). It should first of all be noted that "smart semiconductor switch" is only a common name and in this context the word "smart" does not per se imply any specific technical features, except that the semiconductor switch has a control circuit 11, the function of which extends beyond the mere switching on and off of a transistor $T_1$.

According to FIG. 1, the smart semiconductor switch 10 includes (inter alia) a supply node VS and an output node OUT, which are coupled by means of the transistor $T_1$ such that the nodes VS and OUT are electrically connected when the transistor $T_1$ is switched on and isolated from one another when the transistor $T_1$ is switched off. The supply node VS is supplied with a supply voltage $V_S$ during operation, while an electrical load, which is symbolized by the impedance $Z_L$ in FIG. 1, is connected to the output node OUT. When the transistor $T_1$ is switched on, a load current $i_{LOAD}$ flows from a voltage supply to the load $Z_L$ via the node $V_S$, the load current path of the transistor $T_1$ and the node OUT. In the example shown, the load $Z_L$ is connected between the node OUT and the node ground. The smart semiconductor switch is accordingly a high-side switch. In other exemplary embodiments, the semiconductor switch 10 may be in the form of a low-side switch, wherein, in this case, the supply connection is usually connected to ground.

In the example shown in FIG. 1, the transistor $T_1$ is a MOS (metal-oxide-semiconductor) field-effect transistor (MOS-FET). Other types of transistors may also be used in other exemplary embodiments (e.g. bipolar transistors, insulated-gate bipolar transistors, etc.). The control electrode of the transistor $T_1$ (in the case of a MOSFET, this is the gate electrode) is actuated, for example, by means of what is known as a gate driver circuit 12. This is usually designed to generate, on the basis of a logic signal ON, a corresponding gate voltage VG, which is supplied to the gate electrode of the transistor $T_1$. A wide variety of variants of gate driver circuits (gate drivers for short) for high-side switches and low-side switches are known per se and are therefore not discussed in more detail here.

The logic level of the logic signal ON determines whether the transistor $T_1$ should be switched on or off. In the example shown, this logic signal ON is generated by the control circuit 11 contained in the smart semiconductor switch. The control circuit 11 may include a supply circuit, and is therefore connected to the nodes $V_S$ (supply voltage $V_S$) and GND (supply node at ground potential). The control circuit 11 may be supplied with various sensor signals or measured information (e.g. relating to the magnitude of the load current or the temperature). Various sensors, measuring circuits for the measurement of load current and temperature are known per se and are therefore not shown in FIG. 1.

A smart semiconductor switch is normally designed to communicate with other circuits such as, for example, with a controller 20 (e.g. a programmable microcontroller). To this end, the control circuit 11 may have a communication interface. By way of example, the communication interface may allow serial data transmission. In practice, SPI (serial peripheral interface) is often used nowadays. In the example shown in FIG. 1, the smart semiconductor switch 10 includes an input node IN for receiving an input signal, which is also a logic signal. By way of example, an input signal with a high level (IN=1) indicates that the control circuit 11 should switch the transistor $T_1$ on. Similarly, an input signal with a low level (IN=0) indicates that the control circuit 11 should switch the transistor $T_1$ off. The level of the logic signal ON generally corresponds to the input signal at the input node IN, unless the control circuit detects a shutdown condition such as an excessively high temperature, an excessively high current, an undervoltage (supply voltage $V_S$ is too small) or the like, for example. The shutdown conditions may be different depending on the implementation and application and may sometimes also be configurable (e.g. by way of the controller 20).

In the example shown in FIG. 1, the smart semiconductor switch 10 includes a diagnostic input DEN and a diagnostic output IS. The diagnostic input DEN may be supplied with a logic signal, which can activate and deactivate a diagnostic mode of the control circuit 11, wherein the control circuit 11 in the diagnostic mode may output a diagnostic signal $i_S$, which in the present example is a current signal, at the output IS. In the example shown, a resistor $R_S$ is connected between the diagnostic output IS and ground. The diagnostic current $i_S$ output at the output IS generates a corresponding voltage VD across the resistor $R_S$ ($V_D = i_S R_S$), which voltage can be supplied, for example, to an analog input of the microcontroller 20. The microcontroller may monitor the operation of the semiconductor switch and the load connected thereto by generating a logic signal for the diagnostic input DEN and evaluating the output diagnostic signal is. The diagnostic signal may, for example, represent the magnitude of the load current or indicate a fault.

Figure 2:
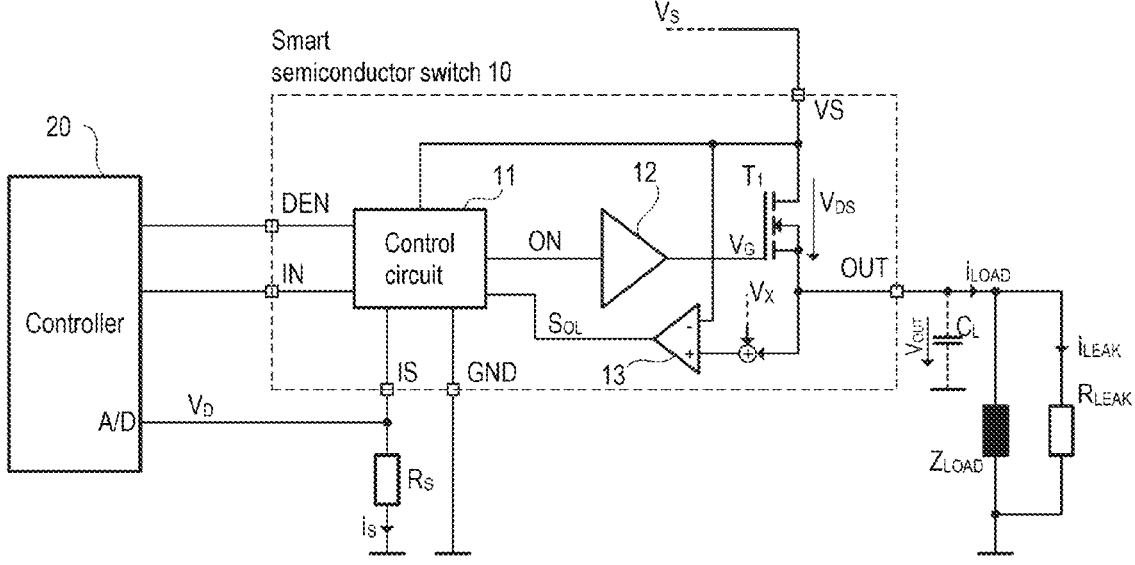
FIG. 2 is a smart semiconductor switch with a function for detecting a leakage current in the load.

FIG. 2 is a circuit diagram of a smart semiconductor switch with a function for detecting a leakage current $i_{LEAK}$ in the load $Z_{LOAD}$ or in parallel with the load. In FIG. 2, the leakage is symbolized by a resistor $R_{LEAK}$ connected in parallel with the load $Z_{LOAD}$, and so, even if the load is inactive, some of the load current $i_{LOAD}$ flows through the resistor $i_{LEAK}$ as leakage current $i_{LEAK}$. It goes without saying that the resistance $R_{LEAK}$ represents only one possible cause of leakage. In practice, an undesirable leakage current may be caused by a wide variety of effects. By way of example, a leakage current may be caused by insufficient insulation in a cable or a plug-in connector. The capacitor $C_L$ shown in FIG. 2 represents the capacitance at the output OUT. This capacitance may be formed by a discrete capacitive component, which may also be contained in the load $Z_{LOAD}$. The capacitance of cables and plug-in connectors between the output OUT and the load $Z_{LOAD}$ may also contribute to the capacitance $C_L$.

Leakage currents may have undesirable effects. In applications in the automotive sector, there is the risk that the car battery will be discharged too quickly and that the vehicle will no longer be able to start after being parked for a relatively long period of time. For this reason, it is desirable to detect leakage currents in a simple way and therefore to be able to easily identify possible faults in a load or a supply line to a load. As already mentioned at the outset, the regular current measurement function of the smart semiconductor switch is not available in the idle mode, and therefore leakage currents cannot be readily detected by means of current measurement.

The circuit from FIG. 2 is essentially the same as the circuit from FIG. 1, wherein an additional comparator 13, which can detect the condition $V_{DS} < V_X$, is provided in FIG. 2. By way of example, the logic signal SOL is at a high level ($S_{OL} = 1$) when this condition is met. In this case, $V_X$ is a predefined or configurable threshold value. The way in which the comparator 13 may be used, together with the control circuit 11, to be able to detect undesirable leakage currents while the smart semiconductor switch 10 is operating in idle mode is explained below with reference to the timing diagrams.

Figure 3:
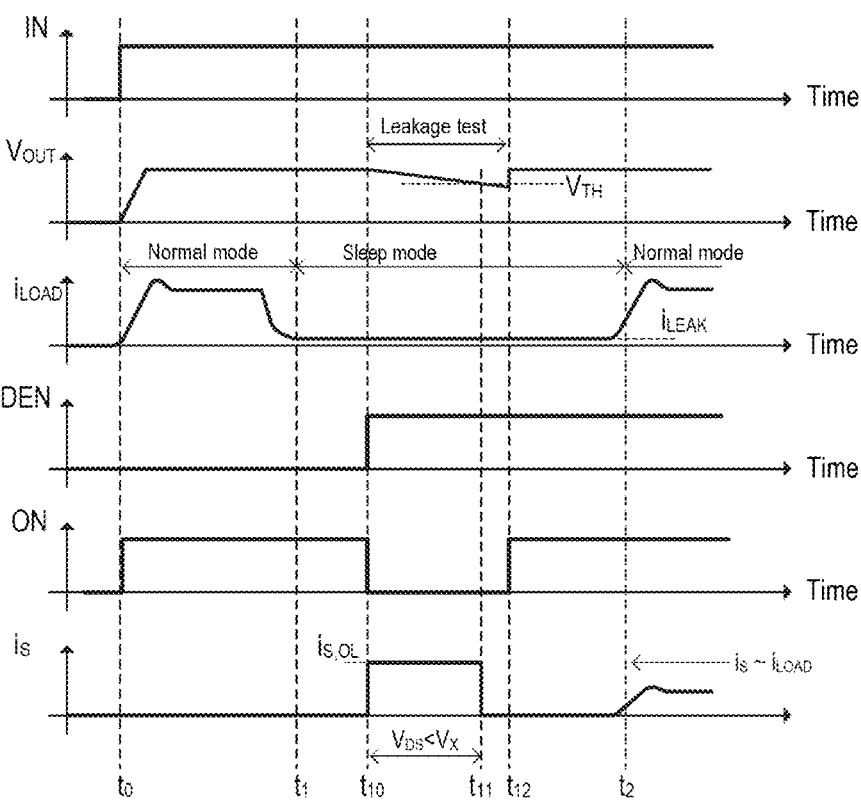
FIG. 3 illustrates a function for leakage current detection according to an exemplary embodiment using timing diagrams.

The first (uppermost) diagram in FIG. 3 shows an example of the signal present at the input IN, which, at the time $t_o$, changes from a low level to a high level and therefore indicates the switching-on of the transistor $T_1$. In response to the level change in the input signal at the time $t_o$, the control circuit 11 also sets the logic signal ON from a low level to a high level (ON=1) in order to switch the transistor $T_1$ on. The delay times between corresponding edges of the input signal and the logic signal ON are negligibly small. The logic signal IN is shown in the fifth diagram of FIG. 3. After the transistor $T_1$ has been switched on, the smart semiconductor switch is operating in normal mode, i.e. all diagnostic functions are available.

When the transistor $T_1$ is switched on, the output voltage $V_{OUT}$, which is output at the output node OUT, also increases to a value close to the supply voltage $V_S$. It holds true that $V_{OUT}=V_S-V_{DS}=V_S-R_{ON} \cdot i_{LOAD}$, wherein $R_{ON}$ refers to the (relatively small) switch-on resistance of the transistor $T_1$. The output voltage $V_{OUT}$ is shown in the second diagram of FIG. 3. The load current $i_{LOAD}$ is shown by way of example in the third diagram of FIG. 3. The load current $i_{LOAD}$ depends on the properties of the load. Between the times $t_o$ and $t_1$, the load requires a significant load current $i_{LOAD}$. At the time $t_1$, the load current $i_{LOAD}$ falls below a threshold value needed to change to the idle mode, and the smart semiconductor switch changes from the normal mode to the idle mode. The reasons for which the load current $i_{LOAD}$ decreases are irrelevant. This may be caused, for example, by a user manually deactivating the load.

At the time $t_{10}$, the controller triggers a leakage current detection (leakage current test) by detecting a logic signal with a high level at the input DEN while the transistor $T_1$ is switched on and the smart semiconductor switch is operating in the idle mode. The logic signal at the input DEN is shown in the fourth diagram of FIG. 3. In order to carry out the leakage current test, the transistor $T_1$ is temporarily shut down, for example by the control circuit 11 setting the signal ON to a low level at the time $t_{10}$ (or immediately afterwards). On account of the high level at the input DEN, a diagnostic current $i_S$ is output at the diagnostic output IS ($i_S=i_{S,OL}$), which indicates that the condition $V_{DS}<V_X$ has been met (corresponds to $V_S-V_{OUT}<V_X$ or $V_{OUT}>V_S-V_X$).

After the transistor $T_1$ has been switched off, the capacitance $C_L$ at the output OUT buffer-stores the output voltage $V_{OUT}$. However, when the transistor $T_1$ is switched off, the output voltage $V_{OUT}$ decreases (i.e. the drain-source voltage $V_{DS}$ becomes greater), since the capacitance $C_L$ is being discharged. The current $i_{LOAD}$, which is responsible for discharging the capacitor, consists of the current flowing through the load (which may be very small when the load is inactive) and the leakage current $i_{LEAK}$. The greater the current, the faster the capacitance $C_L$ is discharged.

In the example shown, the voltage $V_{OUT}$ reaches the threshold value $V_S-V_X$ at the time $t_{11}$. The above-mentioned condition $V_{OUT}>V_S-V_X$ is accordingly no longer met and the control circuit 11 reduces the diagnostic current from $i_S=i_{S,OL}$ or to $i_S=0$. This allows the microcontroller to measure the time period between the times $t_{10}$ and $t_{11}$. The control circuit 11 receives this information directly from the comparator 13, which monitors the condition $V_{OUT}>V_S-V_X$. The time period $t_{11}-t_{10}$ depends on the current through the load $Z_{LOAD}$ and the leakage current $i_{LEAK}$. If the load is inactive, meaning that the current through the load is zero or negligibly small, the leakage current $i_{LEAK}$ essentially determines the time period $t_{11}-t_{10}$.

Shortly after the time $t_{11}$, the leakage current test has ended and the control circuit 11 switches the transistor $T_1$ on again at the time $t_{12}$. The smart semiconductor switch is still in the idle mode at this time. In the example shown, the load $Z_{LOAD}$ is activated again at a later point, at the time $t_2$ (for whatever reasons), the load current flowing through the load increases to the nominal value, which causes the smart semiconductor switch to leave the idle mode and to change back to the normal mode.

The comparator 13 allows the control circuit 11 to detect whether the time period $t_{11}-t_{10}$ is, or is not, less than a threshold value TK ($t_{11}-t_{10}<T_K$). If the condition $t_{11}-t_{10}<T_K$ has been met, then the leakage current $i_{LEAK}$ is most likely too great. In the example shown, the diagnostic current $i_S$ contains a pulse of the length $t_{11}-t_{10}$, which also allows the controller 20 to check the condition $t_{11}-t_{10}<T_K$.

The threshold value $T_K$ may be configurable, meaning that a suitable threshold value may be set specifically for the respective application and depending on the capacitance $C_L$ and the maximum permissible leakage current. The output of the diagnostic current $i_S$ is only an example and not absolutely necessary. As mentioned, the control circuit 11 may evaluate the condition $t_{11}-t_{10}<T_K$ itself using the comparator 13. The information (e.g. a fault message) may also be forwarded to an external unit such as, for example, the controller 20 in other ways, such as by means of the SPI interface that has already been mentioned, for example. The specific implementation will depend on the specific application.

Figure 4:
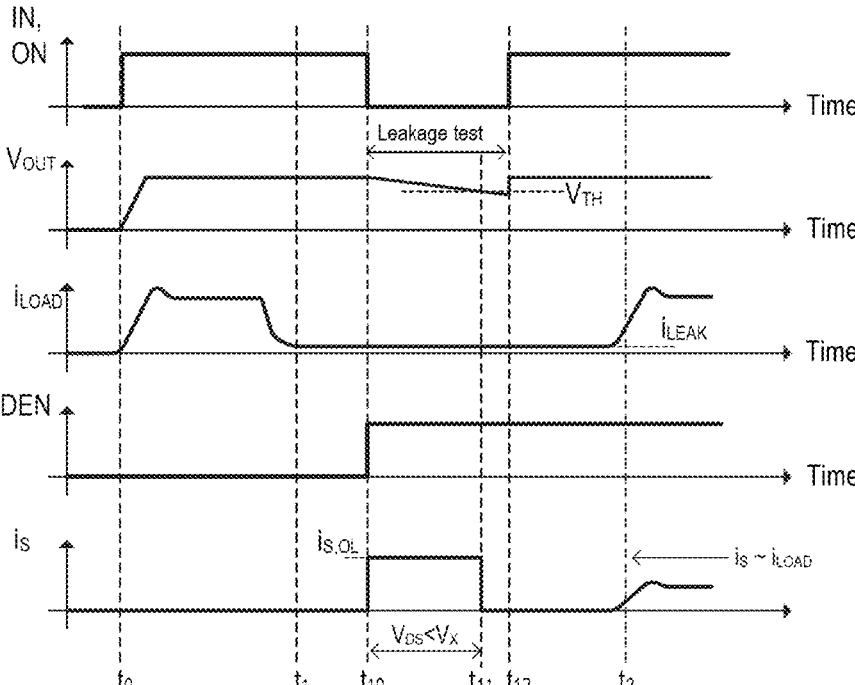
FIG. 4 relates to an alternative to FIG. 3.

The already-mentioned variant, in which the leakage test (leakage current test) is not carried out and controlled by the smart semiconductor switch 10, but by the controller 20, is shown in FIG. 4. The second, third, fourth and fifth diagrams in FIG. 4 are the same as the corresponding diagrams from FIG. 3. The only difference is that the temporary shutdown of the transistor $T_1$ is not independently triggered by the control circuit 11, but by the external controller 20, which actively shuts down the semiconductor switch by means of the input signal at the input node IN (at the time $t_{10}$ and actively switches it on again after the test has ended (at the time $t_{12}$). In this case, the logic signal ON follows the input signal at the input IN. As mentioned, instead of a logic signal, a corresponding command may also be transmitted by means of a serial communication interface, such as SPI, for example. In this case, the condition $t_{11}-t_{10}<T_K$ is evaluated by the controller 20, which can evaluate the pulse width in the current signal is (or in the corresponding voltage signal $V_D$) and compare it with the threshold value $T_K$. This function of the controller 20 may be implemented, for example, by means of a processor and suitable software.

As mentioned, the capacitance $C_L$ is a design parameter that may depend on the application. Assuming that the value $V_X$ (for the evaluation of the condition $V_{OUT}>V_S-V_X$) is 1.8 V, the maximum permissible current (load current including leakage current) is 75 mA and the threshold value $T_K$ is 10 ms, then the capacitance $C_L$ must be about 420 μF (75 mA·10 ms/1.8V=416.67 μF). If it is desired to reduce the capacitance and leave the remaining parameters the same, an additional current source is required. In the example from FIG. 5, this is designated by $Q_P$.

Figure 5:
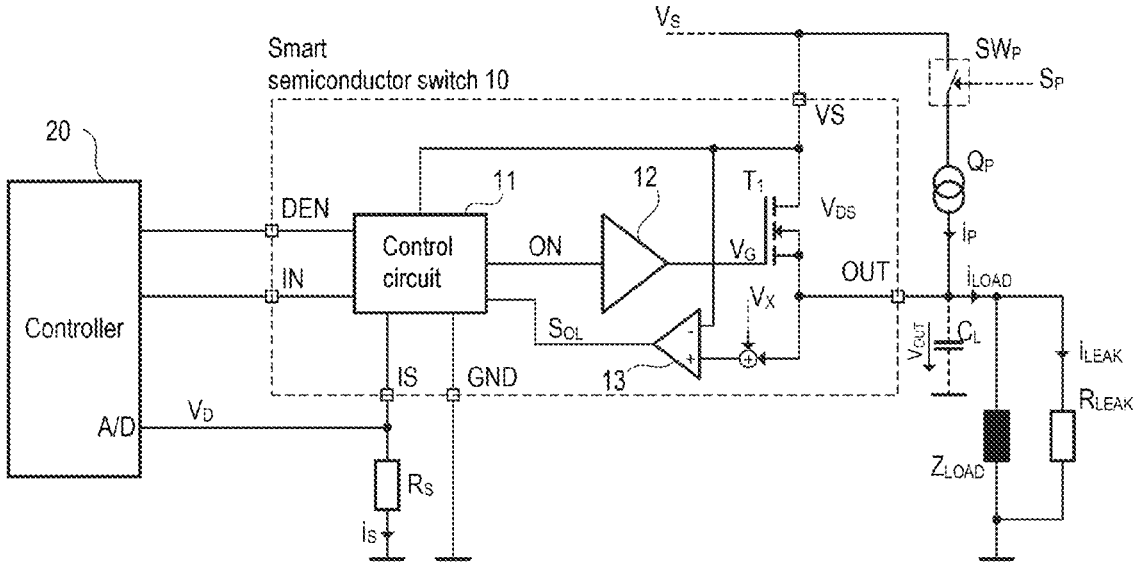
FIG. 5 shows a modification/extension of the exemplary embodiment from FIG. 3.

The circuit in FIG. 5 is a modification/extension of the circuit from FIG. 3. The only difference between FIG. 3 and FIG. 5 is the current source $Q_P$, which may be activated and deactivated by means of an electronic switch $SW_P$. The current source may also be formed by a simple resistor (pull-up resistor). The control signal $S_P$ for activating and deactivating the switch $SW_P$ (and thus the current source $Q_P$) may be generated, for example, by the controller 20. By way of example, if the current source is configured to supply 37 mA during the leakage current test ($i_P=37$ mA), the capacitance $C_L$ will discharge only at 38 mA instead of 75 mA (as in the previous example). This allows the capacitance $C_L$ to be reduced from 420 µF to approximately 210 µF (38 mA·10 ms/1.8V=211.1 µF).

For a given capacitance $C_L$ (e.g. 420 µF), a given threshold value $T_K$ (e.g. 10 ms) and a given $V_X$ (e.g. 1.8 V), the maximum current is $C_L \cdot V_X / T_K$ (75.6 mA in the current example). The current source current $i_P$ of the current source $Q_P$ (bias current) is overlaid on the leakage current $i_{LEAK}$ and therefore changes, ceteris paribus, the maximum current. It goes without saying that the connectable current source $Q_P$ may also be arranged inside of the smart semiconductor switch 10. In one exemplary embodiment in which this is the case, the control circuit 11 may be designed to activate the current source (or a pull-up resistor) during the leakage current test and then to deactivate it again.

Figure 6:
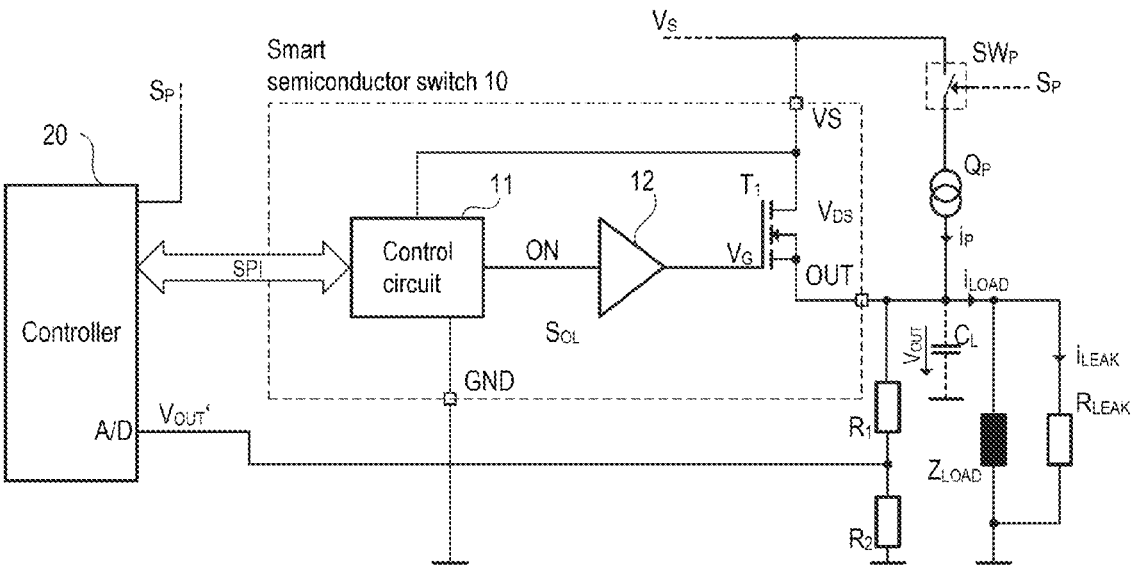
FIG. 6 shows a modification/extension of the exemplary embodiment from FIG. 5.

FIG. 6 shows a modification/extension of the exemplary embodiment from FIG. 5. The circuit from FIG. 6 is essentially the same as the circuit from FIG. 5, wherein, in FIG. 6, the diagnostic output IS and the comparator 13 for the leakage current test are not required (and may therefore be omitted or not be implemented). Instead, the controller 20 is designed to measure the output voltage $V_{OUT}$, for example, by virtue of a scaled version $V_{OUT}'$ of the output voltage $V_{OUT}$ being supplied to an analog input (designated by A/D in the drawings) of the controller 20. In the example shown, the scaling is implemented by means of a voltage divider that is formed by the resistors $R_1$ and $R_2$. These are connected in series between the output nodes OUT and ground. The center tap of the series circuit composed of $R_1$ and $R_2$ is connected to the analog input of the controller 20. Furthermore, in FIG. 6, a digital communication interface (specifically an SPI interface) is implemented instead of the inputs IN and DEN.

Figure 7:
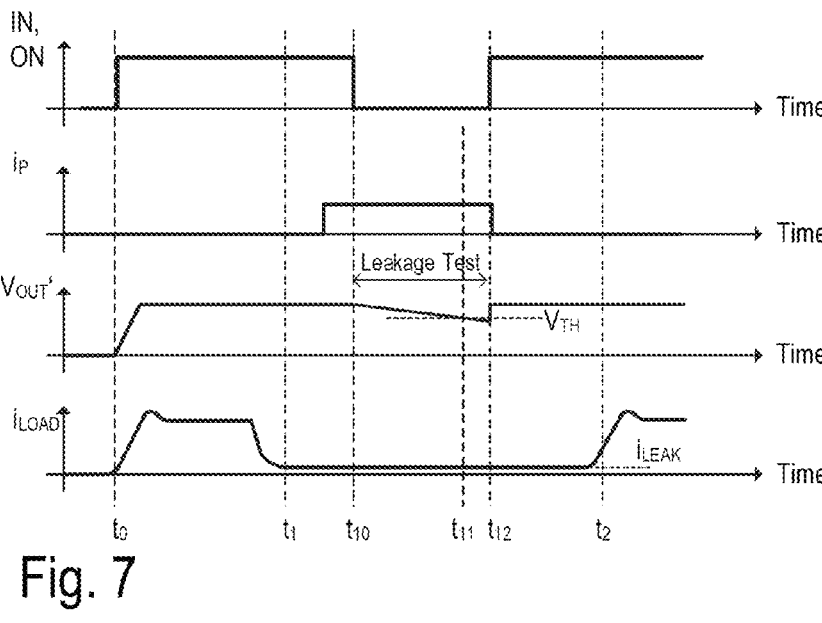
FIG. 7 illustrates a function for leakage current detection according to the exemplary embodiment from FIG. 6 using timing diagrams.

The controller 20 may, for example, evaluate the scaled output voltage $V_{OUT}'$ by means of an analog-to-digital converter in order to ascertain the time interval $t_{11}-t_{10}$ and compare this with a threshold value $T_K$. This function is illustrated using the timing diagrams in FIG. 7. The fundamental procedure is the same as in the example from FIG. 4. The first timing diagram of FIG. 7 is the same as in FIG. 4 and shows the input signal at the input node IN, using which the controller 20 can temporarily shut down the transistor $T_1$ in order to carry out a leakage current test. The second diagram shows the current $i_P$ that is provided by the current source $Q_P$. In the current example, the controller activates the current source $Q_P$ before starting the leakage current test. At the time $t_{10}$, the transistor $T_1$ is shut down and the leakage current test is begun; the capacitor $C_L$ is discharged, wherein the effective discharge current is $i_{LOAD}-i_P$.

The third diagram shows the voltage $V_{OUT}'$ at the center tap of the voltage divider, which voltage is supplied to the controller 20. Said controller may generate a corresponding digital signal $V_{OUT}'[n]$ (n is a time index and designates the individual samples) and compare it with a threshold value $V_{TH}$ ($V_{TH}=V_S-V_X$). In the example shown, this threshold value $V_{TH}$ is reached at the time $t_{11}$. The controller 20 may easily determine whether the threshold value $V_{TH}$ is reached before or after the time $t_{10}+T_K$ ($T_K$ is the time threshold value already discussed above) without having to quantitatively determine the time period $t_{11}-t_{10}$ (this applies to all the exemplary embodiments). The fourth diagram shows the profile of the load current and is the same as in the previous examples.

It goes without saying that the exemplary embodiments described here may be modified in various ways without changing the basic function of the leakage current detection described here. By way of example, in the last example (FIGS. 6 and 7), the diagnostic input DEN is not absolutely required. The input node IN is not necessary if a digital communication interface such as an SPI, for example, is provided in the smart semiconductor switch. The current source $Q_P$ may be arranged inside the smart semiconductor switch or externally thereto. Instead of a single current source $Q_P$, multiple current sources and/or pull-up resistors may also be used inside and/or outside of the smart semiconductor switch. In this context, a pull-up resistor is understood to mean a possible implementation of a current source.

The smart semiconductor switch may be integrated into a single semiconductor chip, which is arranged in a chip package. Alternatively, the components of the smart semiconductor switch may be integrated into two or more chips, which are, however, arranged in a single chip package. The input nodes IN and DEN, the output node OUT, the supply node VS, the diagnostic output IS and the ground connection GND may be in the form of regular chip pins, solder balls and the like.

As mentioned, the controller 20 may be a microcontroller that contains a processor and peripherals such as, for example, analog-to-digital converters, memories, etc. The memory contains processor instructions that can be executed by the processor. In this way, the function of the controller 20 may be essentially determined using software. However, this is not necessarily the case. Combined software and hardware solutions with one-time programmable (OTP) logic are also possible.

The examples described here are summarized below. It goes without saying that this is not a complete list of the essential characteristics, but merely an exemplary summary.

Figure 8:
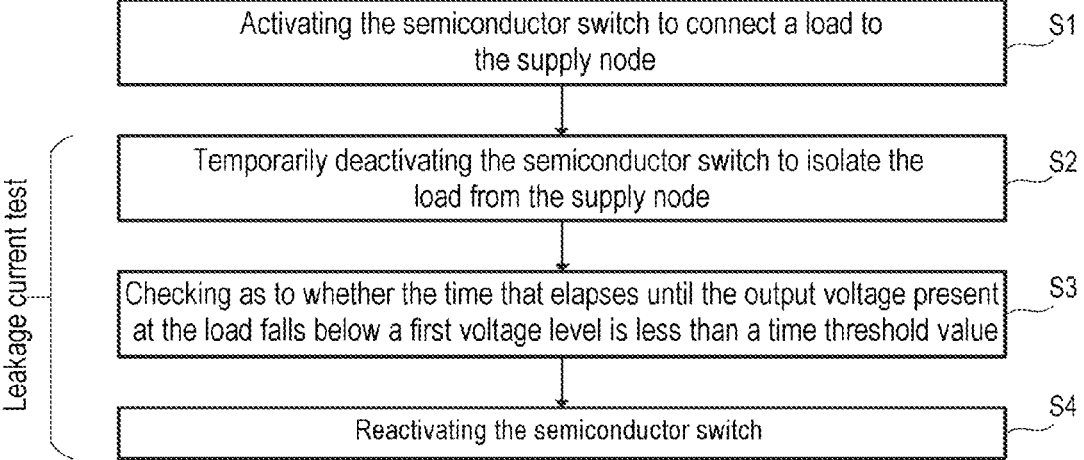
FIG. 8 is a flowchart for illustrating the leakage current detection test.

A first example relates to a method for a smart semiconductor switch, which is shown as a flowchart in FIG. 8. Accordingly, the method comprises activating (switching on) a semiconductor switch (see FIG. 8, step S1) that connects a supply node, to which a supply voltage is provided, to an output node, to which an electrical load is connected, to apply an output voltage to the electrical load (see FIG. 2, 5 or 6, the nodes VS and OUT are electrically connected by switching the transistor $T_1$ on). When the semiconductor switch is switched on, a test is carried out to detect a leakage current that is possibly present (leakage current test). This test comprises (temporarily) deactivating the semiconductor switch (see FIG. 8, step S2) in order to isolate the electrical load from the supply node. As a result, the output voltage is only buffer-stored by the capacitor at the output node, and the capacitor is discharged (cf. FIG. 3, 4 or 7). The test also comprises checking as to whether a time (cf. time period $t_{11}-t_{10}$ in FIGS. 3, 4 and 7) that elapses until the output voltage falls below a first voltage level is less than a threshold value (see FIG. 8, step S3). The semiconductor switch is then activated again (see FIG. 8, step S4).

The time (e.g. $t_{11}-t_{10}$) that elapses until the output voltage falls below the first voltage level ($V_{OUT} \leq V_{TH}$) does not have to be explicitly measured. A wide variety of possibilities for comparing time intervals (e.g. represented by pulse lengths in logic signals) is known to a person skilled in the art. In one example, the time $t_{11}-t_{10}$ is explicitly measured and compared with the threshold value (e.g. digitally in the controller 20; cf. FIG. 6). The threshold value may depend on the output capacitance (cf., e.g., $C_L$ in FIG. 2) and/or on a maximum permissible leakage current $i_{LEAK}$, max.

In one exemplary embodiment, the semiconductor switch is activated and deactivated by means of a control circuit, wherein the control circuit (cf. FIG. 2, 5 or 6) may operate in a normal mode and in an idle mode. "Idle mode" is merely a name for an operating mode with low power consumption, in which many of the components and functions of the smart semiconductor switch are inactive and are not available. The idle mode usually requires the load current to be less than a current threshold value. It is particularly expedient to carry out the leakage current test in the idle mode when the load consumes no current or only a very small quiescent current, wherein the leakage current test can be triggered at any time by a diagnostic command (e.g. received via the SPI interface or a level change at the input DEN, cf. FIG. 2, 5 or 6).

In some exemplary embodiments, a current pulse or a voltage pulse may be output at a diagnostic output, wherein the pulse length corresponds to the time that elapses until the output voltage falls below the first voltage level (cf., e.g., FIG. 3, diagnostic current $i_S$ at the output IS).

Further examples relate to a smart semiconductor switch comprising at least one transistor that is connected between a supply node and an output node, and comprising a control circuit (cf. FIG. 2, 5 or 6). This control circuit is designed to switch the transistor on and off. The control circuit is designed to carry out a leakage current test in response to a diagnostic command. In this case, the transistor is temporarily switched off, and a pulse with a pulse length that corresponds to the time that elapses until the output voltage output at the output node falls below a first voltage level is output as a diagnostic signal (see, e.g., FIG. 2, signal is). The transistor is then switched on again. A current source may be coupled to the output node and designed to output a bias current at (i.e. feed said bias current into) the output node. The bias current is overlaid on the load current flowing through the transistor, wherein the maximum permissible leakage current $i_{LEAK}$, max may depend on the bias current. The current source may be arranged inside or outside of the smart semiconductor switch.

The check as to whether the pulse length of the diagnostic signal is less than a threshold value may be carried out by an external controller (see FIG. 5, controller 20). Alternatively, this check may also be carried out by the internal control circuit of the smart semiconductor switch. In this case, an output of the diagnostic signal is not necessary.

What is claimed is:

1. A method comprising:
   activating a semiconductor switch coupled between a supply node and an output node to apply an output voltage to an electrical load coupled to the output node, wherein a supply voltage is provided to the supply node; and
   performing a leakage current test, comprising:
      deactivating the semiconductor switch to isolate the electrical load from the supply node;
      while the semiconductor switch is deactivated, checking whether a time that elapses from the deactivation of the semiconductor switch until the output voltage falls below a first voltage level is less than a threshold value; and
      activating the semiconductor switch after the checking.

2. The method as claimed in claim 1, wherein checking whether the time is less than the threshold value comprises:
   measuring the time that elapses until the output voltage falls below the first voltage level; and
   comparing the measured time with the threshold value.

3. The method as claimed in claim 1, wherein the threshold value depends on a capacitance coupled to the output node or a maximum permissible leakage current.

4. The method as claimed in claim 1, wherein the semiconductor switch is activated and deactivated by a control circuit configured to operate in a normal mode and in an idle mode, wherein, in the idle mode, a load current flowing through the semiconductor switch to the output node is less than a current threshold value.

5. The method as claimed in claim 4, wherein the leakage current test is carried out while the control circuit is operating in the idle mode.

6. The method as claimed in claim 1, wherein the leakage current test is performed in response to receiving a diagnostic command.

7. The method as claimed in claim 6, wherein:
   the diagnostic command is received via a digital communication interface; or
   the diagnostic command is a level change in a logic signal that is received at a diagnostic input.

8. The method as claimed in claim 6, further comprising:
   outputting a current pulse or a voltage pulse at a diagnostic output, wherein a length of the current pulse or the voltage pulse corresponds to the time that elapses until the output voltage falls below the first voltage level.

9. A smart semiconductor switch comprising:
   a transistor connected between a supply node and an output node; and
   a control circuit configured to switch the transistor on and off, and configured to perform a leakage current test comprising:
      switching the transistor off;
      while the transistor is switched off, checking whether a time that elapses from the switching off of the transistor until an output voltage present at the output node falls below a first voltage level is less than a threshold value; and
      switching the transistor on after the checking.

10. The smart semiconductor switch as claimed in claim 9, wherein the control circuit is further configured to:
   generate a diagnostic signal comprising a pulse with a pulse length that corresponds to the time that elapses until the output voltage present at the output node falls below the first voltage level.

11. The smart semiconductor switch as claimed in claim 9, further comprising:
   a circuit node configured to receive a logic signal through the control circuit, wherein a diagnostic command is signaled by the logic signal assuming a predefined level.

12. The smart semiconductor switch as claimed in claim 9, further comprising:
   a digital communication interface configured to receive a diagnostic command.

13. The smart semiconductor switch as claimed in claim 12, wherein a maximum permissible leakage current depends on a bias current.

14. The smart semiconductor switch as claimed in claim 9, further comprising:
   a current source coupled to the output node and configured to provide a bias current at the output node that is overlaid on a load current flowing through the transistor.

15. A circuit comprising:
   a transistor connected between a supply node and an output node;
   a control circuit configured to switch the transistor on and off; and
   a controller coupled to the control circuit and configured to perform a leakage current test comprising:
      switching the transistor off using the control circuit;
      while the transistor is switched off, checking whether a time that elapses from the switching off of the transistor until an output voltage at the output node falls below a first voltage level is less than a threshold value; and switching the transistor on after the checking.

16. The circuit as claimed in claim 15, wherein the controller is configured to signal an excessively high leakage current in response to a result of the checking indicating that the time that elapses is shorter than the threshold value.

17. The circuit as claimed in claim 15, wherein the controller is configured to generate a first logic signal for the control circuit, wherein the first logic signal is configured to cause the control circuit to switch the transistor on and off.

18. The circuit as claimed in claim 15, wherein:

the controller is configured to generate a second logic signal for the control circuit; and the second logic signal is configured to cause the control circuit to output a diagnostic signal that depends on a load current flowing through the transistor.

19. The circuit as claimed in claim 15, wherein:

the control circuit is configured to operate in a normal mode and in an idle mode; and in the idle mode, a load current output at the output node is configured to be less than a current threshold value.

20. The circuit as claimed in claim 19, wherein the leakage current test is performed during the idle mode and in response to a diagnostic command.

\* \* \* \* \*